(12) United States Patent
Zong et al.

(10) Patent No.: US 9,172,564 B2
(45) Date of Patent: Oct. 27, 2015

(54) METHOD FOR DETECTION USING A YI ALGORITHM, AND YI DETECTOR

(75) Inventors: Kai Zong, Shanghai (CN); Dan Zhao, Shanghai (CN); Meng Hua, Shanghai (CN); Gengshi Wu, Shanghai (CN); Zhiqun Chen, Shanghai (CN)

(73) Assignee: Huawei Device Co., Ltd., Shenzhen (CN)

( * ) Notice: Subject to any disclaimer, the term of this patent is extended or adjusted under 35 U.S.C. 154(b) by 945 days.

(21) Appl. No.: 13/360,257

(22) Filed: Jan. 27, 2012

(65) Prior Publication Data

US 2012/0123730 A1    May 17, 2012

Related U.S. Application Data

(63) Continuation of application No. PCT/CN2010/072173, filed on Apr. 24, 2010.

(30) Foreign Application Priority Data

Jul. 29, 2009 (CN) .......................... 2009 1 0157433

(51) Int. Cl.
*H04L 25/03* (2006.01)
*H03M 13/37* (2006.01)
*H03M 13/41* (2006.01)

(52) U.S. Cl.
CPC ..... *H04L 25/03178* (2013.01); *H03M 13/3738* (2013.01); *H03M 13/41* (2013.01)

(58) Field of Classification Search
CPC ........................................................ H04L 27/00
USPC ........................................................ 370/310
See application file for complete search history.

(56) References Cited

U.S. PATENT DOCUMENTS 5,822,340 A    10/1998 Stenström et al.
5,907,586 A    5/1999 Katsuragawa et al.
(Continued)

FOREIGN PATENT DOCUMENTS

CN    1151669 A    6/1997
CN    1224545 A    7/1999
(Continued)

OTHER PUBLICATIONS

Office Action issued in corresponding Chinese Patent Application No. 200910211439.8, mailed Aug. 31, 2011.
(Continued)

*Primary Examiner* — Anh-Vu Ly
*Assistant Examiner* — Abdullahi Ahmed
(74) *Attorney, Agent, or Firm* — Brinks Gilson & Lione

(57) ABSTRACT

In the field of communications technologies, embodiments of the present invention provide a method for detection using a YI algorithm and a YI detector, so as to solve the technical problem of poor detection performance caused by signal environment variation in the prior art. In the embodiment of the present invention, parameters are obtained according to a received signal; a level threshold at each level starting from a level corresponding to a Tailbits value is obtained according to the parameters, and validity of at least one node at the level is determined according to the level threshold, where the level is the same as a level of the level threshold; and a detection identifier is output according to the validity. The embodiment of the present invention is mainly applied to a scenario of detection using thresholds.

10 Claims, 3 Drawing Sheets

(56) References Cited

U.S. PATENT DOCUMENTS

| | | | |
|---|---|---|---|
| 6,175,590 | B1 | 1/2001 | Stein |
| 7,162,675 | B2 | 1/2007 | Das et al. |
| 2002/0090041 | A1 | 7/2002 | Marsili |
| 2003/0192003 | A1 | 10/2003 | Das et al. |
| 2004/0001428 | A1* | 1/2004 | Datta et al. ............ 370/208 |
| 2006/0291593 | A1* | 12/2006 | Allpress et al. ............ 375/343 |
| 2008/0267128 | A1 | 10/2008 | Benett et al. |
| 2008/0298334 | A1 | 12/2008 | Arviv et al. |
| 2009/0022250 | A1* | 1/2009 | Zhong et al. ............ 375/341 |
| 2009/0180323 | A1* | 7/2009 | Park et al. ............ 365/185.12 |
| 2010/0039968 | A1* | 2/2010 | Papageorgiou ............ 370/310 |

FOREIGN PATENT DOCUMENTS

| | | |
|---|---|---|
| CN | 1266577 A | 9/2000 |
| CN | 1859694 A | 11/2006 |
| CN | 1868158 A | 11/2006 |
| CN | 1972170 A | 5/2007 |
| CN | 101291537 A | 10/2008 |
| CN | 101400090 A | 4/2009 |
| CN | 101472349 A | 7/2009 |
| CN | 101489288 A | 7/2009 |
| CN | 101605021 A | 12/2009 |
| CN | 101605021 B | 8/2012 |
| WO | WO 2008081310 A1 | 7/2008 |
| WO | WO 2011/012000 A1 | 2/2011 |

OTHER PUBLICATIONS

Written Opinion of the International Searching Authority issued in corresponding PCT Patent Application No. PCT/CN2010/075270, mailed Oct. 28, 2010.

International Search Report issued in corresponding PCT Patent Application No. PCT/CN2010/075270, mailed Oct. 28, 2010.

LTE, 3$^{rd}$ Generation Partnership Project; Technical Specification Group Services and System Aspects; Circuit Switched Fallback in Evolved Packet System: Stage 2 (Release 8) 3GPP TS 23.272, V8.4.0, Jun. 2009.

Extended European Search Report issued in corresponding European Patent Application No. 10803833.2, mailed May 3, 2012.

Lucent Technologies, "Performance of the HS-SCCH" Agenda Item AH32, HSDPA. 3GPP TSG-RAN WG1#25. Paris, France, Apr. 9-12, 2002. R1-02-0649 XP-002301041.

Written Opinion of the International Searching Authority issued in corresponding PCT Patent Application No. PCT/CN2010/072173, mailed Jul. 29, 2010.

International Search Report issued in corresponding PCT Patent Application No. PCT/CN2010/072173, mailed Jul. 29, 2010.

* cited by examiner

<Prior Art>

METHOD FOR DETECTION USING A YI ALGORITHM, AND YI DETECTOR

CROSS-REFERENCE TO RELATED APPLICATIONS

This application is a continuation of International Application No. PCT/CN2010/072173, filed on Apr. 24, 2010, which claims priority to Chinese Patent Application No. 200910157433.7, filed on Jul. 29, 2009, both of which are hereby incorporated by reference in their entireties.

FIELD OF THE INVENTION

The present invention relates to the field of communications technologies, and in particular to a detection method using a (Yamamoto-Itoh, YI) algorithm and a YI detector.

BACKGROUND OF THE INVENTION

It is specified in the industry that a high speed shared control channel (High Speed Shared Control Channel, HS-SCCH) is ahead of a high speed physical downlink shared channel (High Speed Physical Downlink Shared Channel, HS-PDSCH) by 2 slots (Slot). The objective of such a specification is to facilitate a user equipment (User Equipment, UE) to use the 2 slots to first detect a Slot1 portion of the HS-SCCH. If the detection succeeds, it indicates that a transmitted sub-frame is the sub-frame belonging to the UE. Then the UE decodes data of Slot2, and begins a process of buffering demodulation data of the HS-PDSCH. Therefore, correct detection of the HS-SCCH Slot1 is of great importance for throughput and power consumption of the UE.

In the prior art, the YI algorithm is generally used for the detection of the HS-SCCH Slot1.

The YI algorithm is mainly to trace and mark a path in the process of Viterbi (Viterbi) decoding. A method for marking the path of each state in each step is: selecting a path a that enters the state and has a maximum likelihood path metric and a path b that enters the state and has a sub-maximum likelihood path metric. If a difference between the path metric of a and the path metric of b is greater than or equal to a threshold A, the path a is marked as C; otherwise, the path a is marked as X, and all other paths other than a are discarded. An optimized path of each state in every step is selected in such a manner till a final level. The process for detecting the HS-SCCH Slot1 using the YI algorithm is described below with reference to FIG. 1.

As shown in FIG. 1, it is assumed that 4 reserved paths for 4 states 0, 1, 2, 3, at a level j−1 are respectively a, b, c, d, and are all identified as C.

It can be seen from FIG. 1 that at a level j, paths a-e and are incorporated into the same node of state 0, and paths b-g and d-h are incorporated into the same node of state 2.

If $$\lambda_j(a-e)-\lambda_j(c-f) \geq A$$

$$0 < (\lambda_j(b-g)-\lambda_j(d-h)) > A$$

where $\lambda_j(a-e)$ is a maximum likelihood path metric of the path a-e, $\lambda_j(c-f)$ is a maximum likelihood path metric of the path (c-f), $\lambda_j(a-e)-\lambda_j(c-f)$ is a path metric difference (Path Metric Difference, PMD) of the node of state 0 at the level j, and A is a threshold;

$\lambda_j(b-g)$ is a maximum likelihood path metric of the path (b-g), $\lambda_j(d-h)$ is a maximum likelihood path metric of the path (d-h), $\lambda_j(b-g)-\lambda_1(d-h)$ is a PMD of the node of state 2 at the level j;

then the path a-e is identified as C, the path b-g is identified as X, that is, at the level j, the node of state 0 is marked as C, and the node of state 2 is marked as X.

As shown in FIG. 1, at a level j+1, a path a-e-s and a path b-g-t are incorporated into the same node of state 0; that is, $$\lambda_{j+1}(b-g-t) \geq \lambda_{j+1}(a-e-s)+A$$

where $\lambda_{j+1}(b-g-t)$ is a maximum likelihood path metric of the path (b-g-t), and $\lambda_{j+1}(a-e-s)$ is a maximum likelihood path metric of the path (a-e-s).

The path b-g-t is still identified as X, because at the level j, the path b-g has been identified as X. The process is repeated till the decoding is completed. At the final level, if a survival path with the maximum path metric is identified as X, or a node in a backtracing path is marked as X, the detection is considered as a failure; otherwise, the detection is considered as a success, and ("success") is output.

The process may be briefly described as follows: In the YI algorithm, the HS-SCCH Slot1 is detected by judging whether the PMD on a certain node is greater than a threshold. At present, the YI threshold is mainly a fixed threshold obtained empirically and through lots of emulations.

During the implementation of the present invention, the inventors find that the prior art at least has the following problems. In a practical signal environment, due to the influence of channels and interference, received signals fluctuate greatly, so that using a fixed threshold in detection is inapplicable for the situation of multiple signal environments, and therefore the detection performance for the HS-SCCH Slot1 is decreased.

SUMMARY OF THE INVENTION

Embodiments of the present invention provide a method for detection using a YI algorithm, and a YI detector, so as to improve the detection performance of HS-SCCH Slot1 detection using the YI algorithm in different signal environments.

In order to achieve the foregoing objectives, embodiments of the present invention adopt the following technical solutions.

A method for detection using a YI algorithm includes:
obtaining parameters according to a received signal;
obtaining a level threshold according to the parameters at each level starting from a level corresponding to a Tailbits value, and determining validity of at least one node at the level according to the level threshold, where the level is the same as a level of the level threshold; and
outputting a detection identifier according to the validity.

A YI detector includes:
a parameter obtaining module, configured to obtain parameters according to a received signal;
a YI calculation module, configured to obtain a level threshold according to the parameters at each level starting from a level corresponding to a Tailbits value, and determine validity of at least one node at the level according to the level threshold, where the level is the same as a level of the level threshold; and
a YI identifier decision module, configured to output a detection identifier according to the validity.

According to the solutions provided in the embodiments of the present invention, in different signal environments, the threshold changes along with variation of the received signal, which embodies the change of external input signals; in addition, the threshold also changes along with the real-time level change in each stage of the Viterbi decoding, so that the detection performance of HS-SCCH Slot1 detection in different environments is improved. With the improvement of the detection performance, the possibility of incorrect decision decreases accordingly, so that beneficial effects of improving system throughput and reducing power consumption of the UE caused by incorrect decision are achieved.

DETAILED DESCRIPTION OF THE EMBODIMENTS

Before the description of the implementation of the present invention, a process for determining a level threshold used in embodiments of the present invention is introduced first.

In the YI algorithm, a threshold needs to be determined for judging validity of a state of each node in a Viterbi decoding process: when a PMD of the node is greater than the threshold, it is considered that the detection is valid; otherwise, it is considered that the detection is invalid, that is, unreliable. Therefore, the accuracy of the threshold greatly affects the detection performance of the YI algorithm. For simplicity, it is assumed that the received signal has the following format:

$$x_k(t)=A_k+n(t); \quad (1)$$

where $A_k$ denotes an amplitude of a $k^{th}$ transmitted signal; n(t) denotes additive white gaussian noise (Additive White Gaussian Noise, AWGN) at time t, and n(t) follows $N(0,\sigma^2)$ normal distribution, that is, $n(t) \sim N(0,\sigma^2)$, $\sigma^2$ denotes a noise variance; and $x_k(t)$ denotes a signal received at time t.

Meanwhile, the amplitude $A_k$ of the signal meets the following assumption:

$$A_k = \begin{cases} -A, \text{When } "1" \text{ is transmitted} \\ A, \text{When } "0" \text{ is transmitted} \end{cases} \quad (2)$$

and then, signal $x_k(t) \sim N(A_k,\sigma^2)$ is transmitted.

Figure 1:
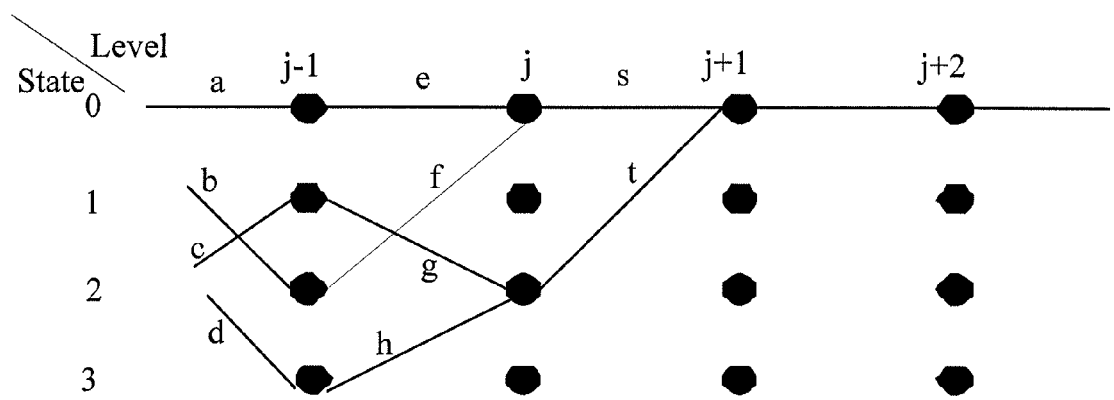
FIG. 1 is a schematic diagram of a YI algorithm in the prior art.
Figure 2:
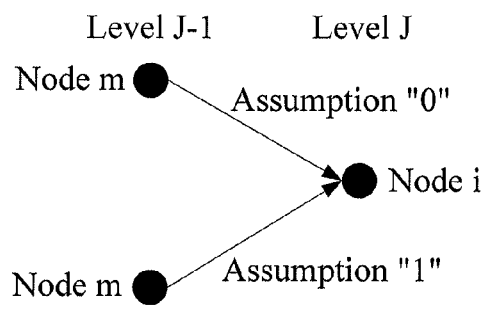
FIG. 2 is a schematic diagram of a Viterbi decoding node in an embodiment of the present invention.

As shown in FIG. 2, at a node i at a jth level, the following assumption may exist.

Two paths converge at the node i, that is, 0 assumes that a branch path is from a node m at a (j−1)th level; and 1 assumes that a branch path is from a node n at the (j−1)th level. A path metric at the node i may be represented by accumulated path metric and the branch metric according to different assumption values.

Specifically, the following expression may be used:

$$\lambda_i^j = \begin{cases} B(0)+\lambda_m^{j-1}, \text{assumption } 0 \\ B(1)+\lambda_n^{j-1}, \text{assumption } 1 \end{cases} \quad (3)$$

where $\lambda_m^{j-1}$ and $\lambda_n^{j-1}$ respectively denote path metrics separately accumulated at the node m and the node n at the level j−1; B(0) and B(1) respectively denote branch metrics determined by a current input at the jth level and corresponding to the assumption 0 and the assumption 1. In the following analysis, a convolutional code with a bit rate of ⅓ (HS-SCCH Slot1 uses a convolutional code with a bit rate of ⅓) is considered. According to a Viterbi decoding principle, it can be obtained that B(1)=−B(0).

According to that in Viterbi decoding, only the property having a maximum likelihood path metric is selected, a $PMD_i^j$ and a branch metric difference (Branch Metric Difference, BMD) $BMD_i^j$ at the node i at the jth level may be expressed as follows:

$$BMD_i^j = \begin{cases} B(0)-B(1); B(0)+\lambda_m^{j-1} > B(1)+\lambda_n^{j-1} \\ B(1)-B(0); B(1)+\lambda_m^{j-1} > B(0)+\lambda_n^{j-1} \end{cases} \quad (4)$$

$$PMD_i^j = \begin{cases} BMD_i^j + (\lambda_m^{j-1}-\lambda_n^{j-1}); B(0)+\lambda_m^{j-1} > B(1)+\lambda_n^{j-1} \\ BMD_i^j + (\lambda_n^{j-1}-\lambda_m^{j-1}); B(1)+\lambda_n^{j-1} > B(0)+\lambda_m^{j-1} \end{cases} \quad (5)$$

In the expression (5), $\lambda_m^{j-1}$ and $\lambda_n^{j-1}$ are determined by an input prior to the jth level, and are independent of an input at the jth level, that is, a current input, and therefore, for simplicity, it is considered that in the case of the current input, $PMD_i^j$ is determined only by $BMD_i^j$.

Hereinafter, the distribution of $BMD_i^j$ in the case that the current input is determined only by $BMD_i^j$ is introduced.

It is assumed that the current input is $x_k, x_{k+1}, x_{k+2}$, and the input is independently identically distributed (I.I.D), and has the format as shown in formula (1), that is, $$x_k(t)=A_k+n(t);$$

It is assumed that corresponding assumption coefficients are respectively $h_0^{(\alpha)}, h_1^{(\alpha)}, h_2^{(\alpha)}$, α is corresponding to assumption 0 and assumption 1.

According to the Viterbi decoding principle, B(0) and B(1) may be expressed as follows:

$$B(0)=h_0^{(0)}*x_k+h_1^{(0)}*x_{k+1}+h_2^{(0)}*x_{k+2} \quad (6\text{-}1)$$

$$B(1)=h_0^{(1)}*x_k+h_1^{(1)}*x_{k+1}+h_2^{(1)}*x_{k+2} \quad (6\text{-}2)$$

According to the property of two branch paths in Viterbi decoding during Slot1 detection in the prior art, it can be obtained that:

$$h_0^{(1)}=-h_0^{(0)}=-1, h_1^{(1)}=-h_1^{(0)}=-1, h_2^{(1)}=-h_2^{(0)}=-1, |h_k^{(\alpha)}|=1, k=0,1,2; \alpha+=0,1 \quad (6\text{-}3)$$

where $(B(0)-B(1))_i^j$ is referred to as a branch path difference between a path a and a path b that are incorporated into the node i in a state j.

Because 3 input sample values $x_k, x_{k+1}, x_{k+2}$ are I.I.D. that is, having independency and irrelevance, the following conclusions are drawn:

$$B(0) \sim N(h_0^{(0)}*A_k+h_1^{(0)}*A_{k+1}+h_2^{(0)}*A_{k+2}, 3\sigma^2) \quad (6\text{-}4)$$

$$B(1) \sim N(h_0^{(1)}*A_k+h_1^{(1)}*A_{k+1}+h_2^{(1)}*A_{k+2}, 3\sigma^2) \quad (6\text{-}5)$$

It is assumed that $$|A_k|=|A_{k+1}|=|A_{k+2}|=A \quad (6\text{-}6).$$

The conclusion (6-3) and the (6-6) are introduced into (6-4) and (6-5), and it can be obtained that:

$$B(1)=-B(0) \quad (6\text{-}7);$$

According to the (6-7), $B(0) B(1)$ has the following distribution:

$$(B(0) - B(1)) = (2 * B(0)) \sim N\left(2 * A * \sum_{i=0}^{2} h_i^{(0)}, 12\sigma^2\right); \quad (6\text{-}8)$$

When the 3 assumptions of 0 respectively corresponding to $x_k, x_{k+1}, x_{k+2}$ are all correct, $$\sum_{i=0}^{2} h_i^{(0)} = 3.$$

When one of the 3 assumptions of 0 respectively corresponding to $x_k, x_{k+1}, x_{k+2}$ is incorrect, $$\sum_{i=0}^{2} h_i^{(0)} = 1.$$

When two of the 3 assumptions of 0 respectively corresponding to $x_k, x_{k+1}, x_{k+2}$ are incorrect, $$\sum_{i=0}^{2} h_i^{(0)} = -1.$$

When the 3 assumptions of 0 respectively corresponding to $x_k, x_{k+1}, x_{k+2}$ are all incorrect, $$\sum_{i=0}^{2} h_i^{(0)} = -3.$$

That is, according to the distributions of $B(0)$ and $B(1)$ previously considered, and the obtained property of the assumption coefficient $h_k^{(\alpha)}$, $k=0,1,2$; $\alpha=0,1$, it can be obtained that either the 3 assumptions are all correct, or only one assumption is incorrect, and therefore, the current branch metric difference $BMD_i^j$ is as shown as the following expression:

$$BMD_i^j \sim \begin{cases} N(6A, 12\sigma^2); \text{ the 3 assumptions are all correct} \\ N(2A, 12\sigma^2); \\ \quad \text{only one of the 3 assumptions is incorrect} \\ N(-2A, 12\sigma^2); \\ \quad \text{only two of the 3 assumptions are incorrect} \\ N(-6A, 12\sigma^2); \text{ the 3 assumptions are all incorrect} \end{cases} \quad (6)$$

Because the input data is independently identically distributed (IID), a branch metric value of a certain node is only associated with the current input, that is, associated with $B(0)$ or $B(1)$, and is independent of the foregoing accumulated path metric, that is, $\lambda_m^{j-1}$ or $\lambda_n^{j-1}$. Furthermore, it can be known according to the expression (3) that the path metric of a current node is a sum of the previously accumulated path metric and the branch metric of the current node; therefore when the path metric of the current node is investigated, the previously accumulated path metric can be regarded as a fixed constant. Therefore, the setting of the threshold of the PMD at the current node may be mainly considered from a statistical meaning of the BMD.

In this manner, in the decoding process, as shown in FIG. 2, the nodes m and n in the state j−1 is converged into the node i in the state j; it is assumed that $\lambda_{m-n}^{j-1}$ is the previously accumulated PMD, that is, the PMD between the node m and the node n at the level j−1; the expression of $\lambda_{m-n}^{j-1}$ may use the following format:

$$\lambda_{m-n}^{j-1} = \begin{cases} \lambda_m^{j-1} - \lambda_n^{j-1}; B(0) + \lambda_m^{j-1} > B(1) + \lambda_n^{j-1} \\ \lambda_n^{j-1} - \lambda_m^{j-1}; B(1) + \lambda_n^{j-1} > B(0) + \lambda_m^{j-1} \end{cases} \quad (7)$$

For the selection of $\lambda_{m-n}^{j-1}$ in the expression (7), considering that the path metric prior to the jth level is independent of the current input, and in view of improving the detection reliability, a portion having the maximum accumulated PMD in the accumulated PMDs obtained through every two nodes at the level j−1 may be used, which specifically may be in a format of the following expression:

$$\lambda^{j-1} = \text{Max}(\lambda_{m-n}^{j-1}); \quad (8)$$

where $\lambda^{j-1}$ denotes a maximum accumulated PMD in the accumulated PMDs obtained through every two nodes at the level j−1; and m and n denote any two nodes at the (j−1)th level, and have a value of; m,n=0, . . . $2^{Tailbits}-1$, in which a value of $2^{Tailbits}$ denotes the number of Tailbits states.

According to the expression (6), $\lambda_{m-n}^{j-1}$ may be introduced to obtain the following distribution of $PMD_i^j$:

$$PMD_i^j \sim \begin{cases} N(6A + \lambda_{m-n}^{j-1}, 12\sigma^2); \\ \quad \text{the 3 assumptions are all correct} \\ N(2A + \lambda_{m-n}^{j-1}, 12\sigma^2); \\ \quad \text{only one of the 3 assumptions is incorrect} \\ N(-2A + \lambda_{m-n}^{j-1}, 12\sigma^2); \\ \quad \text{only two of the 3 assumptions are incorrect} \\ N(-6A + \lambda_{m-n}^{j-1}, 12\sigma^2); \\ \quad \text{the 3 assumptions are all incorrect} \end{cases} \quad (7\text{-}1)$$

Considering that the YI algorithm is used mainly for the purpose of improving the detection reliability, the current node at the current level can be judged as validity provided that not only that a high path metric can be obtained from the current input, but also that the previous path metric reaches a relatively high value. Therefore, the maximum value is selected for $\lambda_{m-n}^{j-1}$, and is recorded as $\lambda^{j-1}$ (the expression (8)); and $\lambda^{j-1}$ is introduced into the formula (7-1), it can be obtained that:

$$PMD_i^j \sim \begin{cases} N(6A + \beta \cdot \lambda^{j-1}, 12\sigma^2); \\ \quad \text{the 3 assumptions are all correct} \\ N(2A + \beta \cdot \lambda^{j-1}, 12\sigma^2); \\ \quad \text{only one of the 3 assumptions is incorrect} \\ N(-2A + \beta \cdot \lambda^{j-1}, 12\sigma^2); \\ \quad \text{only two of the 3 assumptions are incorrect} \\ N(-6A + \beta \cdot \lambda^{j-1}, 12\sigma^2); \\ \quad \text{the 3 assumptions are all incorrect} \end{cases} \quad (8\text{-}2)$$

It can be known from the expression (6) that, in practical application, the 3 assumptions are not necessarily all correct, and therefore in the level threshold expression provided in the (8-2), $\lambda^{j-1}$ is multiplied by a coefficient factor $\beta$, to ensure the detection effectiveness and improve the detection probability.

It can be known from the (8-2) that, when an actual distribution of $PMD_i^j$ is most close to $N(6A+\beta\cdot\lambda^{j-1},12\sigma^2)$, the system has desirable detection performance. According to a relation between variance distribution and probability in the statistics principle, and $PMD_i^j$ distribution in the (8-2), the formula for a level threshold to be used in the embodiment of the present invention is as follows:

$$YI_{Threshold}{}^j=\beta*\lambda^{j-1}+6A-4.0*\sqrt{12\sigma^2}, \beta\epsilon(0.7\text{~}1.0); \quad (9)$$

where $\beta$ denotes a coefficient factor, $\lambda^{j-1}$ denotes the maximum accumulated PMD at the level j−1, A denotes an amplitude of a received signal, $\sigma^2$ denotes a noise variance, and $YI_{Threshold}{}^j$ denotes a level threshold at the jth level, j=Tailbits,Taibits+1, . . . , Inforbits+Tailbits−1. The Tailbits denotes a Tailbits value, and the Inforbits denotes a valid data transmission length.

The technical solutions of the present invention will be described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention. The embodiments below are all optional solutions of the present invention, and the ranking order and numbering of the embodiments are independent of an exemplary execution order.

Embodiment 1

Figure 3:
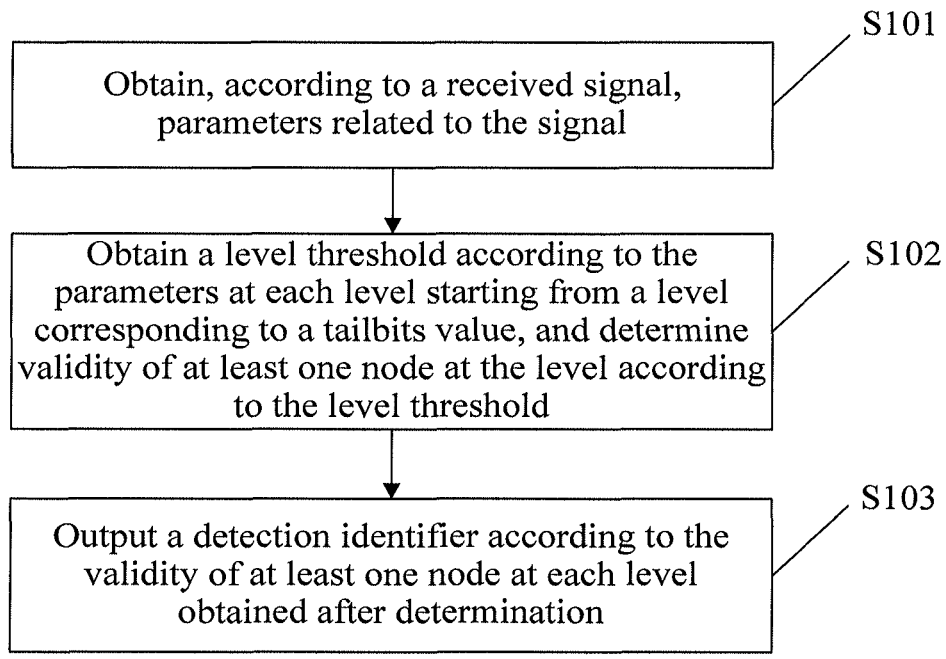
FIG. 3 is a schematic flow chart of a method for detection using a YI algorithm according to Embodiment 1 of the present invention.

This embodiment provides a method for detection using a YI algorithm. As shown in FIG. 3, the method includes the following steps.

S101: Obtain, according to a received signal, parameters related to the signal.

S102: At each level starting from a level corresponding to a Tailbits value, that is, if K=Tailbits, at each level starting from a $K^{th}$ level (including the level K), perform the following operations: obtain a level threshold at a level A (it is assumed that the level A is any level starting from the level K) according to the parameters, set the level threshold to a level A threshold, and determine validity of at least one node at the level A according to the level A threshold.

The rest may be deduced by analogy, till that the determination of at least one node at each level starting from the $K^{th}$ level in the decoding process ends.

S103: Output a detection identifier according to the validity of at least one node at each level obtained after determination.

The embodiment of the present invention has the following beneficial effect. According to different received signals, different level thresholds can be obtained. In the case that the received signals are different due to different environments, the corresponding level threshold can be used for judgment of validity, thereby improving the detection performance of the HS-SCCH Slot1 detection using the YI algorithm.

Embodiment 2

Figure 4:
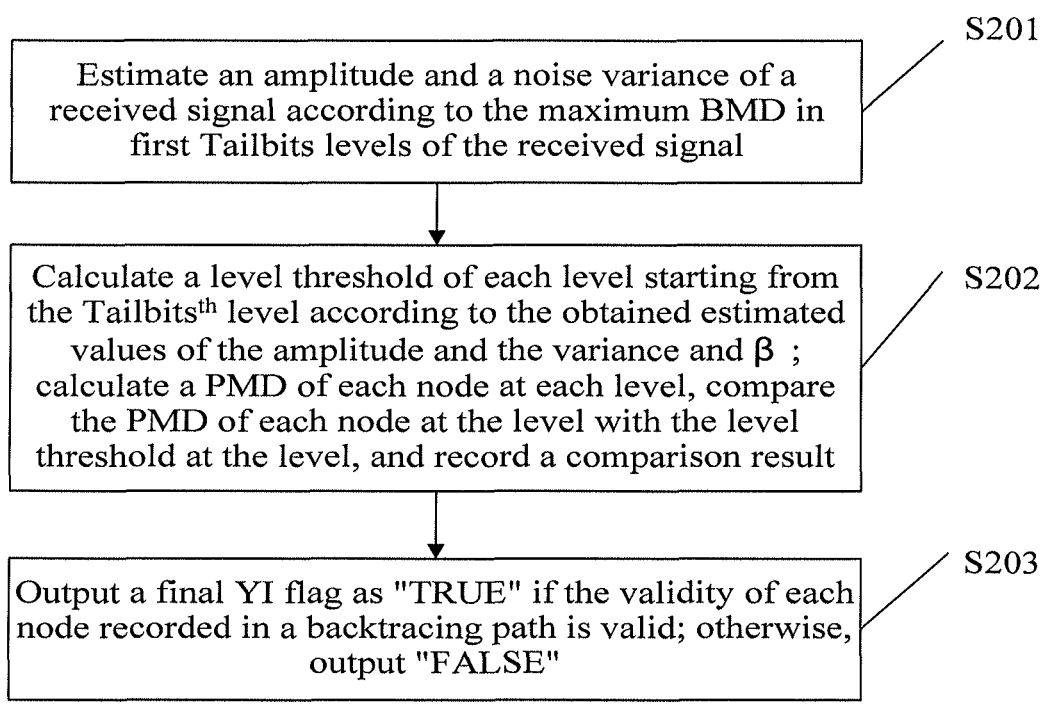
FIG. 4 is a schematic flow chart of a method for detection using a YI algorithm according to Embodiment 2 of the present invention.

This embodiment specifically describes a method for detection using a YI algorithm. As shown in FIG. 4, the method includes the following steps:

S201: Estimate an amplitude and a noise variance of a received signal according to the maximum BMD in first Tailbits levels of the received signal.

Specifically, it is assumed that K=Tailbits, the first Tailbits levels are first K levels; the maximum BMD obtained through calculation in a decoding process in the first K levels is extracted, and an estimated value E(6A) of an amplitude 6A of the received signal and an estimated value $E(12\sigma^2)$ of a noise variance $12\sigma^2$ of AWGN are estimated according to the maximum BMD.

In the YI algorithm, the investigation on the validity of a YI flag should start from a $Tailbits^{th}$ level; in addition, it can be known from an analysis on the expression (6) that, the maximum value in $BMD_i^j$ should follow $N(6A,12\sigma^2)$ distribution. Therefore, in step S201, the maximum BMD value at the first Tailbits levels is extracted to obtain the estimated values E(6A) and $E(12\sigma^2)$ of the signal amplitude and the variance.

S202: Calculate a level threshold of each level starting from the $Tailbits^{th}$ level according to a coefficient factor $\beta$ after E(6A) and $E(12\sigma^2)$ are obtained.

Specifically, calculation may be performed according to the formula (9):

that is, $$YI_{Threshold}{}^j=\beta*\lambda^{j-1}+E(6A)-4.0*\sqrt{E(12\sigma^2)}, \beta\epsilon(0.7\text{~}1.0),$$

j=Tailbits,Taibits+1, . . . , Inforbits+Tailbits−1 where $\beta$ denotes a coefficient factor, $\lambda^{j-1}$ denotes the maximum accumulated PMD at a level j−1, A denotes an amplitude of a received signal, $\sigma^2$ denotes a noise variance, $YI_{Threshold}{}^j$ denotes a level threshold at a jthjthlevel.

Furthermore, for each level, a PMD of each node at the level is calculated, and the PMD of each node at the level is compared with a level threshold at the level. If the PMD of the node at the level is no less than the level threshold, it is decided that the node is valid, and the validity of the node is recorded as valid; if the PMD of the node is less than the level threshold, it is decided that the node is invalid, and the validity of the node is recorded as invalid. The rest may be deduced by analogy, till the decoding of the last level (j=Tailbits−1) ends.

Specifically, the process may be as follows:

For example, at a $K^{th}$ level, a level threshold may be expressed as:

$$YI_{Threshold}{}^k=\beta*\lambda^{k-1}+E(6A)-4.0*\sqrt{E(12\sigma^2)}, \beta\epsilon(0.7\text{~}1.0)$$

Meanwhile, a PDM $PMD_i^k$,i=0, . . . , $2^{Tailbits}-1$ of each node at the $K^{th}$ level is calculated, where i denotes any node at the $K^{th}$ level. Each of the $PMD_i^k$ is compared with the $YI_{Threshold}{}^k$, YI validity of each node at the $K^{th}$ level is determined according to the following:

If $PMI_i^k \geq YI_{Threshold}{}^k$, it is decided that the node is valid for Yi, and the node is recorded as valid.

If $PMI_i^k > YI_{Threshold}{}^k$, it is decided that the node is invalid for YI, and the node is recorded as invalid.

The rest may be deduced by analogy. In the subsequent decoding process, the YI validity of each node at each level is decided, and a result is recorded.

S203: After the decoding ends, in a backtracing process, output a decision identifier according to the validity recorded for each node. If the validity recorded for each node in a backtracing path is valid, a finally given YI flag is "TRUE"; otherwise, "FALSE" is output.

In the embodiment of the present invention, for each detected HS-SCCH, after the Viterbi decoding ends, decoded data and path metric of the state 0 after the decoding ends are also output. If through the YI algorithm, "TRUE" is detected on at least two HS-SCCHs, the path metric of a last 0 node on each HS-SCCH may be compared, and the branch having the maximum path metric of 0 node is extracted for the final decision.

In the detection method of using a YI algorithm provided in the embodiment of the present invention, a technical solution of dynamic level threshold is used, to solve the technical problem in the prior art that the high-efficiency performance detection cannot be performed in various signal environments because the threshold used in the detection using the YI algorithm is fixed, thereby achieving the technical effects that the level threshold for decision can dynamically change along with the change of the signal environment, and the detection performance of HS-SCCH Slot1 detection using the YI algorithm in various signal environments is improved. Meanwhile, because the detection performance is improved, the system throughput is increased, and the power consumption of a UE is reduced. Furthermore, in the technical solution provided in the embodiment, the level threshold for decision changes automatically and dynamically along with the different signal environments, which requires no manual setting and is accordingly more convenient for application as compared with the prior art, in which the threshold is obtained empirically and through lots of emulated data.

Embodiment 3

Figure 5:
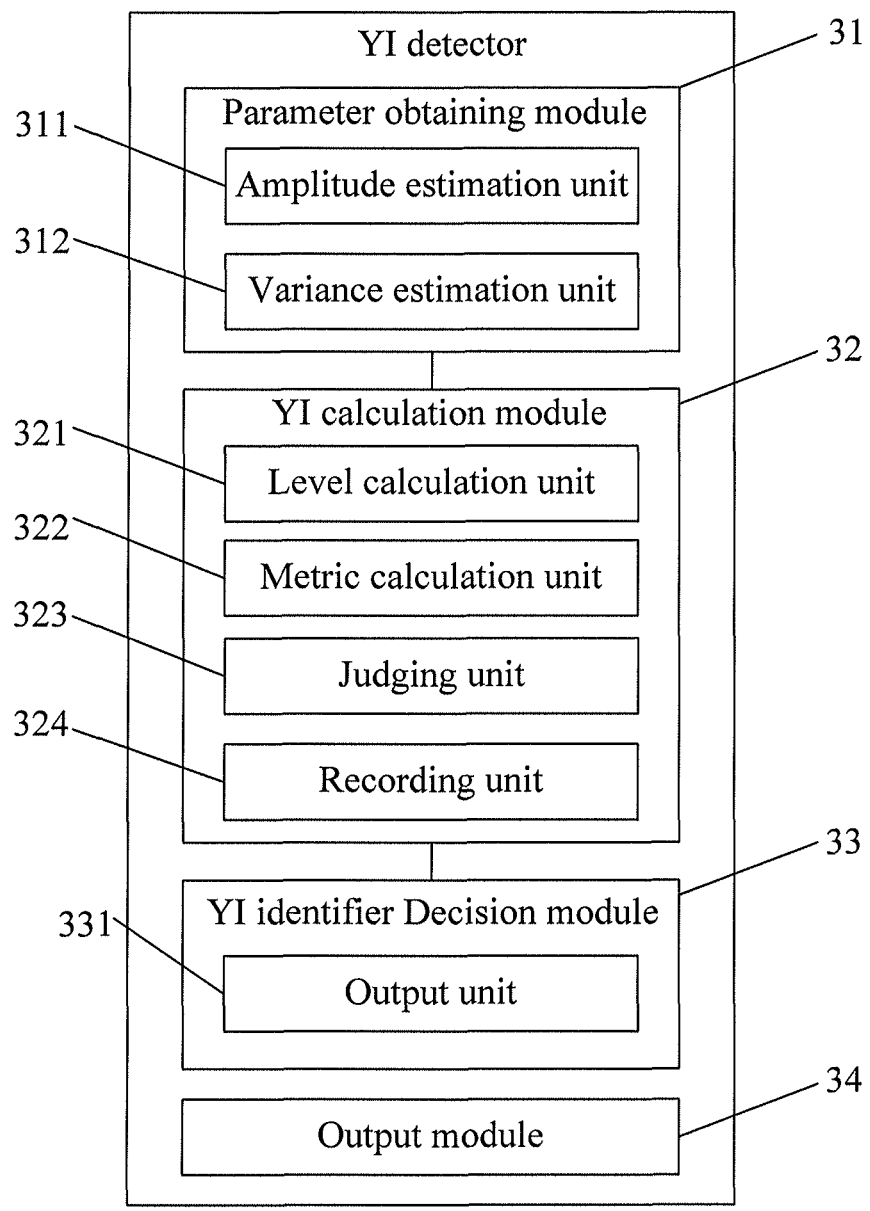
FIG. 5 is a schematic structural diagram of a YI detector according to Embodiment 3 of the present invention.

This embodiment provides a YI detector, to implement the foregoing method. As shown in FIG. 5, the YI detector includes a parameter obtaining module 31, a YI calculation module 32, and a YI identifier decision module 33.

The parameter obtaining module 31 is configured to obtain parameters according to a received signal; the YI calculation module 32 is configured to obtain a level threshold according to the parameters at each level starting from a level corresponding to a Tailbits value, and determine validity of at least one node at the level according to the level threshold, where the level is the same as a level of the level threshold; and the YI identifier decision module 33 is configured to output a detection identifier according to the validity.

The parameter obtaining module 31 includes an amplitude estimation unit 311, and a variance estimation unit 312.

The amplitude estimation unit 311 is configured to obtain an estimated value of an amplitude of the signal according to the maximum BMD in first Tailbits-value levels of the received signal; and the variance estimation unit 312 is configured to obtain an estimated value of a noise variance of the signal according to the maximum BMD in the first Tailbits-value levels of the received signal.

The YI calculation module 32 includes a level calculation unit 321, a metric calculation unit 322, a judging unit 323, and a recording unit 324.

The level calculation unit 321 is configured to calculate the level threshold at the level according to the estimated value of the amplitude of the signal obtained by the amplitude estimation unit 311, the noise variance of the signal obtained by the variance estimation unit 312, and a coefficient factor; the metric calculation unit 322 is configured to calculate a path metric difference of at least one node at the level; the judging unit 323 is configured to decide that the any node is valid when the path metric difference of any node calculated by the metric calculation unit 322 at the level is no less than the level threshold calculated by the level calculation unit, and decide that the any node is invalid when the path metric difference of any node calculated by the metric calculation unit 322 at the level is less than the level threshold calculated by the level calculation unit; and the recording unit 324 is configured to record a decision result of the judging unit 323, record the node as valid when the judging unit 323 decides that the node is valid, and record the node as invalid when the judging unit 323 decides that the node is invalid.

The YI identifier decision module 33 includes an output unit 331. The output unit 331 is configured to output the detection identifier which is TRUE when each node in a backtracing path is recorded as valid; otherwise, output the detection identifier which is FALSE.

Furthermore, the YI detector provided in the embodiment of the present invention may further include an output module 34. The output module 34 is configured to output, for each detected HS-SCCH, a decoding result and a path metric of state 0 after the decoding ends.

The YI detector provided in the embodiment of the present invention has the following beneficial effects. Using the level threshold capable of dynamically changing along with the change of the signal environment in the YI validity decision can improve the detection performance of HS-SCCH Slot1 detection using the YI algorithm in different signal environments. In addition, as the detection performance is improved, the system throughput is increased, and the power consumption of a UE is reduced. Through the path metric of 0 node on each HS-SCCH output by the output module, the incapability of providing a final decision when TRUE is detected on multiple HS-SCCHs can be prevented.

The embodiments of the present invention are mainly applied to a scenario for determining a YI detection threshold during the HS-SCCH Slot1 detection using the YI algorithm in wideband-code division multiple access (Wideband-Code Division Multiple Access, WCDMA). Viterbi decoding is widely applied in communications, and the YI algorithm is a high-performance detection algorithm based on the Viterbi decoding. Therefore, in a communication system adopting the Viterbi decoding, if the YI algorithm is used as a signal detection algorithm, the threshold problem can be considered by using the concept of the method according to the embodiment of the present invention. Furthermore, with the development of the communications and network technologies, the concept and methods embodied in the embodiments of the present invention may be applied to other scenarios in the field, or may be transferred to a similar or close technical field.

Through the above description of the implementation, it is clear to persons skilled in the art that the present invention may be accomplished through software plus a necessary universal hardware platform, or through hardware; however, in most cases, the former is preferred. Based on this, the technical solution of the present invention or the part that makes contributions to the prior art can be essentially embodied in the form of a software product. The computer software product may be stored in a readable storage medium, for example, a floppy disk, a hard disk or an optical disk of the computer, and contain several instructions used to instruct an apparatus (which may be a terminal) to perform part or all of the steps of the method according to the embodiments of the present invention.

The above is only the specific implementation of the present invention, but the protection scope of the present invention is not limited herein. Any change or replacement that can be easily figured out by persons skilled in the art within the technical scope disclosed by the present invention shall be covered by the protection scope of the present invention. Therefore, the protection scope of the present invention shall be the protection scope of the claims.

What is claimed is:

1. A method for detection using a YI algorithm, comprising:

obtaining parameters according to a received signal, wherein the obtaining of the parameters according to the received signal comprises: obtaining an estimated value of an amplitude of the signal and an estimated value of a noise variance of the signal according to a branch metric difference in first Tailbits value levels of the received signal;

obtaining a level threshold according to the parameters at each level starting from a level corresponding to a Tailbits value, and determining validity of at least one node at the level according to the level threshold, wherein the level is the same as a level of the level threshold; and outputting a detection identifier according to the validity.

2. The method for detection using a Yl algorithm according to claim 1, wherein the obtaining the level threshold according to the parameters comprises:

calculating the level threshold at the level according to the estimated value of the amplitude of the signal, the estimated value of the noise variance of the signal, and a coefficient factor;

calculating a path metric difference of at least one node at the level; and the determining the validity of at least one node at the level according to the level threshold comprises:

if the path metric difference of the at least one node at the level is no less than the level threshold at the level, recording that the at least one node is valid;

if the path metric difference of the at least one node at the level is less than the level threshold at the level, recording that the at least one node is invalid.

3. A method for detection using a Yl algorithm, comprising:

obtaining parameters according to a received signal;

obtaining a level threshold according to the parameters at each level starting from a level corresponding to a Tailbits value, and determining validity of at least one node at the level according to the level threshold, wherein the level is the same as a level of the level threshold; and outputting a detection identifier according to the validity, wherein the outputting the detection identifier according to the validity comprises:

outputting the detection identifier as TRUE if each node in a backtracing path is recorded as valid;

outputting the detection identifier as FALSE, if each node in a backtracing path is recorded as invalid.

4. A method for detection using a YI algorithm, comprising:

obtaining parameters according to a received signal;

obtaining a level threshold according to the parameters at each level starting from a level corresponding to a Tailbits value, and determining validity of at least one node at the level according to the level threshold, wherein the level is the same as a level of the level threshold;

outputting a detection identifier according to the validity; and outputting, for each detected channel, a decoding result and a path metric of a state 0.

5. A user equipment comprising a program codes execution hardware, the program codes execution hardware executes program codes stored in a non-transitory computer-readable memory, which configures a decoder in the user equipment to:

obtain parameters according to a received signal, wherein the obtaining of the parameters according to the received signal comprises: obtaining an estimated value of an amplitude of the signal and an estimated value of a noise variance of the signal according to a branch metric difference in first Tailbits value levels of the received signal;

obtain a level threshold according to the parameters at each level starting from a level corresponding to a Tailbits value, and determine validity of at least one node at the level according to the level threshold, wherein the level is the same as a level of the level threshold; and output a detection identifier according to the validity.

6. The user equipment according to claim 5, wherein the user equipment is further configured to:

calculate the level threshold at the level according to the estimated value of the amplitude of the signal obtained by the amplitude estimation unit, the noise variance of the signal obtained by the variance estimation unit, and a coefficient factor;

calculate a path metric difference of at least one node at the level;

when the path metric difference of any node calculated by the metric calculation unit at the level is no less than the level threshold calculated by the level calculation unit, decide that the any node is valid, and when the path metric difference of any node calculated by the metric calculation unit at the level is less than the level threshold calculated by the level calculation unit, decide that the any node is invalid; and record a decision result of the judging unit, record the node as valid when the judging unit decides that the node is valid, and record the node as invalid when the judging unit decides that the node is invalid.

7. The user equipment according to claim 5, wherein the user equipment is further configured to:

output the detection identifier which is TRUE when each node in a backtracing path is recorded as valid; and output the detection identifier which is FALSE when each node in a backtracing path is recorded as invalid.

8. The user equipment according to claim 5, wherein the user equipment is further configured to comprising:

output for each detected channel, a decoding result and a path metric of a state 0 after the decoding ends.

9. A user equipment comprising a program codes execution hardware, the program codes execution hardware executes program codes stored in a non-transitory computer-readable memory, which configures a decoder in the user equipment to:

obtain parameters according to a received signal;

obtain a level threshold according to the parameters at each level starting from a level corresponding to a Tailbits value, and determine validity of at least one node at the level according to the level threshold, wherein the level is the same as a level of the level threshold; and output a detection identifier according to the validity by one of: outputting the detection identifier as TRUE if each node in a backtracing path is recorded as valid; and outputting the detection identifier as FALSE, if each node in a backtracing path is recorded as invalid.

10. A user equipment comprising a program codes execution hardware, the program codes execution hardware executes program codes stored in a non-transitory computer-readable memory, which configures a decoder in the user equipment to:

obtain parameters according to a received signal;

obtain a level threshold according to the parameters at each level starting from a level corresponding to a Tailbits value, and determine validity of at least one node at the level according to the level threshold, wherein the level is the same as a level of the level threshold;

output a detection identifier according to the validity; and output for each detected channel, a decoding result and a path metric of a state 0.

* * * * *